United States Patent
Chou et al.

(10) Patent No.: US 11,404,348 B2
(45) Date of Patent: Aug. 2, 2022

(54) SEMICONDUCTOR PACKAGE CARRIER BOARD, METHOD FOR FABRICATING THE SAME, AND ELECTRONIC PACKAGE HAVING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW); Wen-Chang Chen, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/893,562

(22) Filed: Jun. 5, 2020

(65) Prior Publication Data
US 2020/0388552 A1 Dec. 10, 2020

(30) Foreign Application Priority Data
Jun. 6, 2019 (TW) .................................. 108119732

(51) Int. Cl.
| | |
|---|---|
| *H01L 23/373* | (2006.01) |
| *H01L 21/48* | (2006.01) |
| *H01L 23/498* | (2006.01) |
| *H01L 23/00* | (2006.01) |

(52) U.S. Cl.
CPC ........ *H01L 23/3735* (2013.01); *H01L 21/481* (2013.01); *H01L 21/4853* (2013.01); *H01L 23/49877* (2013.01); *H01L 23/49894* (2013.01); *H01L 24/16* (2013.01); *H01L 24/81* (2013.01); *H01L 2224/16227* (2013.01); *H01L 2224/81395* (2013.01)

(58) Field of Classification Search
CPC .......... H01L 23/3735; H01L 23/49877; H01L 23/49894
See application file for complete search history.

(56) References Cited

U.S. PATENT DOCUMENTS

2019/0333836 A1* 10/2019 Lin .................... H01L 23/5389
2020/0243483 A1* 7/2020 Kuo .................... H01L 23/5385

* cited by examiner

*Primary Examiner* — Errol V Fernandes
(74) *Attorney, Agent, or Firm* — Amin, Turocy & Watson, LLP

(57) ABSTRACT

A semiconductor package carrier board, a method for fabricating the same, and an electronic package having the same are provided. The method includes forming on a circuit structure a graphene layer that acts as an insulation heat dissipating layer. Since the heat conductivity of the graphene layer is far greater than the heat conductivity of ink (about 0.4 W/m·k), which is used as solder resist, the heat of the semiconductor package carrier board can be conducted quickly, and thus can avoid the problem that the heat will be accumulated on the semiconductor package carrier board.

16 Claims, 6 Drawing Sheets

SEMICONDUCTOR PACKAGE CARRIER BOARD, METHOD FOR FABRICATING THE SAME, AND ELECTRONIC PACKAGE HAVING THE SAME

CROSS-REFERENCE TO RELATED APPLICATIONS

This application claims priority to Taiwan Application Serial No. 108119732, filed on Jun. 6, 2019. The entirety of the above-mentioned patent application is hereby incorporated by reference herein and made a part of this specification.

BACKGROUND

1. Technical Field

The present disclosure relates to package substrates, and, more particularly, to a semiconductor package carrier board having a fast heat-dissipating function, a method for fabricating the same, and an electronic package having the same.

2. Description of the Prior Art

In recent years, research and development towards package specification of large-sized chips, such as artificial intelligence (AI) chips, advanced chips, or stacked chips, have come to the market. Accordingly, fabrication processes, such as 3D or 2.5D IC fabrication process, are developed and applied to these advanced products, such as AI chips, GPU, etc., which require high density circuits/high transmission speed/high number of stacked layer/large size.

Accordingly, fabricators use a large-sized flip-chip package substrate, such as board size of 40*40, 70*70, etc., to carry large-sized chips such as AI chips, advanced chips or stacked chips.

As shown in FIG. 1A, a flip-chip package substrate 1 according to the prior art comprises a circuit structure 10 and solder resist layers 12a and 12b disposed on outer sides of the circuit structure 10. A plurality of solder pads 11a and 11b are disposed on the outermost side of the circuit structure 10 and exposed from the solder resist layers 12a and 12b, to act as contacts (i.e., I/O). Therefore, a semiconductor chip (not shown) can be mounted on an upper side (a chip-mounting side shown in FIG. 1B), and a circuit board (not shown) can be mounted on a lower side (a ball-planting side or BGA shown in FIG. 1C), to fabricate an electronic package product.

The heat generated by the flip-chip package substrate 1 during a semiconductor packaging process and an operation on an application end, if not dissipated quickly, will increase the temperature of the whole electronic package product and affect performance or even damage the electronic package product.

In the flip-chip package substrate 1, the solder resist layers 12a and 12b are formed of ink or a solder mask, which has the heat conductivity of about 0.2 to 0.4 W/m·k. Therefore, heat accumulated on the flip-chip package substrate 1 cannot be dissipated quickly, which affects the performance and lifespan of the electronic package product.

Therefore, how to solve the problems of the prior art is becoming an urgent issue in the art.

SUMMARY

In view of the drawbacks of the prior art, the present disclosure provides a semiconductor package carrier board, comprising: a circuit structure having a first side, a second side opposing the first side, at least one dielectric layer, and a circuit layer bonded to the dielectric layer, wherein the circuit layer of the first side and the circuit layer of the second side have a plurality of solder pads; and an insulation heat dissipating layer being a graphene layer, disposed on a whole surface of the first side and/or a whole surface of the second side of the circuit structure, and formed with a plurality of holes, wherein the plurality of solder pads are exposed from the plurality of holes.

In an embodiment, the semiconductor package carrier board further comprises: a bonding material; a rigid layer made of a conductive material or a non-conductive material and bonded to the second side of the circuit structure via the bonding material, wherein the plurality of holes extend into the rigid layer to expose the plurality of solder pads of the second side of the circuit structure; and the insulation heat dissipating layer disposed on the rigid layer and hole walls of the plurality of holes, without being disposed on the plurality of solder pads exposed from the plurality of holes. In another embodiment, the semiconductor package carrier board further comprises a plurality of conductive elements bonded to the plurality of solder pads in the plurality of holes and being in contact with the insulation heat dissipating layer.

In an embodiment, the semiconductor package carrier board further comprises a plurality of conductive elements bonded to the plurality of solder pads exposed from the plurality of holes on the first side and/or the second side of the circuit structure and being in contact with the insulation heat dissipating layer.

The present disclosure also provides an electronic package, comprising: the above-described semiconductor package carrier board; a plurality of conductive elements bonded onto the plurality of solder pads exposed from the first side and/or the second side of the circuit structure and being in contact with the insulation heat dissipating layer; an electronic component mounted in a flip-chip manner on the plurality of conductive elements of the first side of the circuit structure; and an encapsulating layer disposed on the semiconductor package carrier board and bonding the electronic component onto the semiconductor package carrier board.

In an embodiment, the electronic package further comprises: a bonding material; a rigid layer bonded to the second side of the circuit structure via the bonding material and provided with a plurality of holes, from which the plurality of solder pads of the second side of the circuit structure are exposed; and the insulation heat dissipating layer disposed on the rigid layer and hole walls of the plurality of holes, without being disposed on the plurality of solder pads exposed from the plurality of holes, wherein the plurality of conductive elements are bonded to the plurality of solder pads exposed from the second side of the circuit structure and are in contact with the insulation heat dissipating layer.

The present disclosure further provides a method for fabricating a semiconductor package carrier board, the method comprising: providing a circuit structure having a first side, a second side opposing the first side, at least one dielectric layer, and a circuit layer bonded to the dielectric layer, wherein the circuit layer of the first side and the circuit layer of the second side have a plurality of solder pads; forming an insulation heat dissipating layer that is a graphene layer on a whole surface of the first side and/or a whole surface of the second side of the circuit structure; and forming a plurality of holes on the insulation heat dissipating layer, wherein the plurality of solder pads are exposed from the plurality of holes.

In an embodiment, the method further comprises: bonding a rigid layer made of a conductive material or a non-conductive material via a bonding material onto the second side of the circuit structure; forming a plurality of another holes on the rigid layer, from which the plurality of solder pads of the second side of the circuit structure are exposed; encapsulating the rigid layer and the plurality of another holes of the rigid layer with the insulation heat dissipating layer; and removing the insulation heat dissipating layer on the plurality of solder pads in the plurality of another holes to form the plurality of holes, with the insulation heat dissipating layer on the hole walls of the plurality of another holes remained. In another embodiment, the method further comprises: providing a plurality of conductive elements that are in contact with the insulation heat dissipating layer; and bonding the plurality of solder pads in the plurality of another holes of the rigid layer to the plurality of conductive elements.

In an embodiment, the method further comprises: providing a plurality of conductive elements that are in contact with the insulation heat dissipating layer; and bonding the plurality of solder pads exposed in the plurality of holes of the first side and/or the second side of the circuit structure to the plurality of conductive elements.

It is known from the above that in the semiconductor package carrier board, the method for fabricating the same, and the electronic package having the same according to the present disclosure, the graphene layer, which has high heat conductivity, is used as the insulation heat dissipating layer (or a solder resist structure) to improve the heat dissipating performance of the semiconductor package carrier board. Compared with the prior art, the semiconductor package carrier board and the electronic package according to the present disclosure have a very high heat dissipating speed. Therefore, an electronic product having the semiconductor package carrier board and the electronic package according to the present disclosure will have improved performance, and can be applied to a high power product demanding high heat dissipating efficiency.

DETAILED DESCRIPTION

The following illustrative embodiments are provided to illustrate the present disclosure, these and other advantages and effects can be apparently understood by those in the art after reading the disclosure of this specification.

It should be appreciated that the structures, proportions, size and the like of the figures in the present disclosure are intended to be used in conjunction with the disclosure of the specification. They are not intended to limit the invention and therefore do not represent any substantial technical meanings. The details of the specification may be on the basis of different points and applications, and numerous modifications and variations can be devised without departing from the spirit of the present disclosure. As used herein, the terms "over," "first," "second," "one" and the like, are used to distinguish one element from another, and are not intended to limit the scope of the present disclosure. Changes or adjustments are considered to be within the scope of the present disclosure, without departing from the scope of the present disclosure.

Figure 1A:
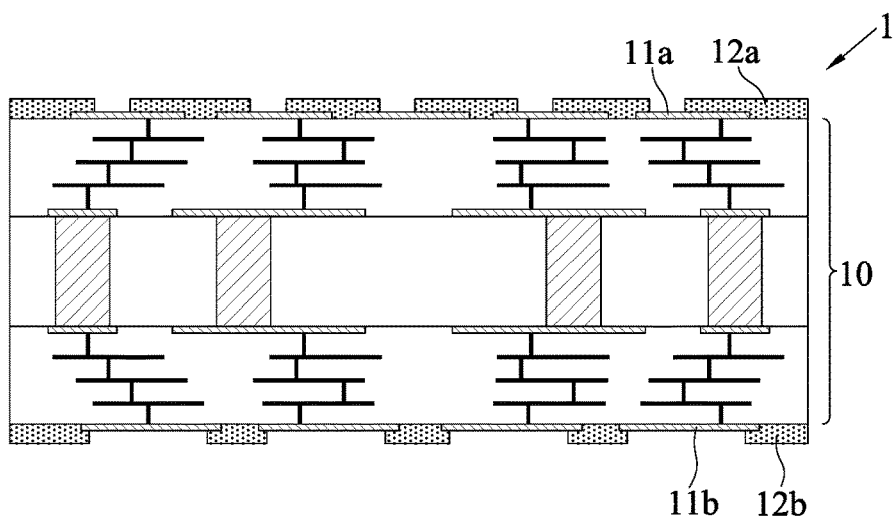
FIG. 1A is a cross-sectional view of a flip-chip package substrate according to the prior art.
Figure 1B:
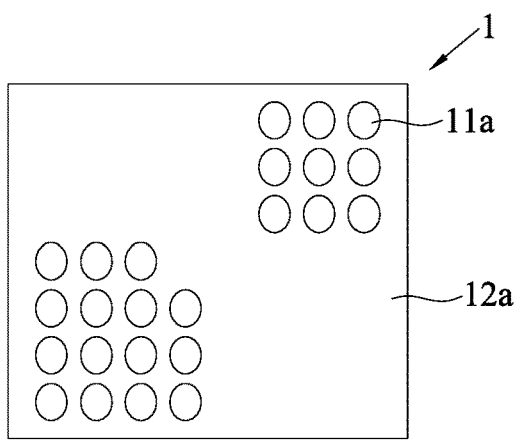
FIG. 1B is a top view of FIG. 1A.
Figure 1C:
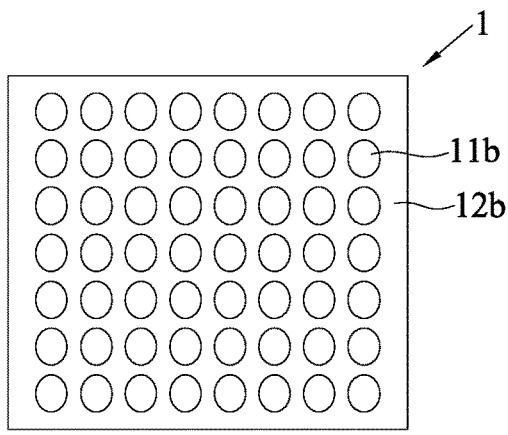
FIG. 1C is a bottom view of FIG. 1A.
Figure 2A:
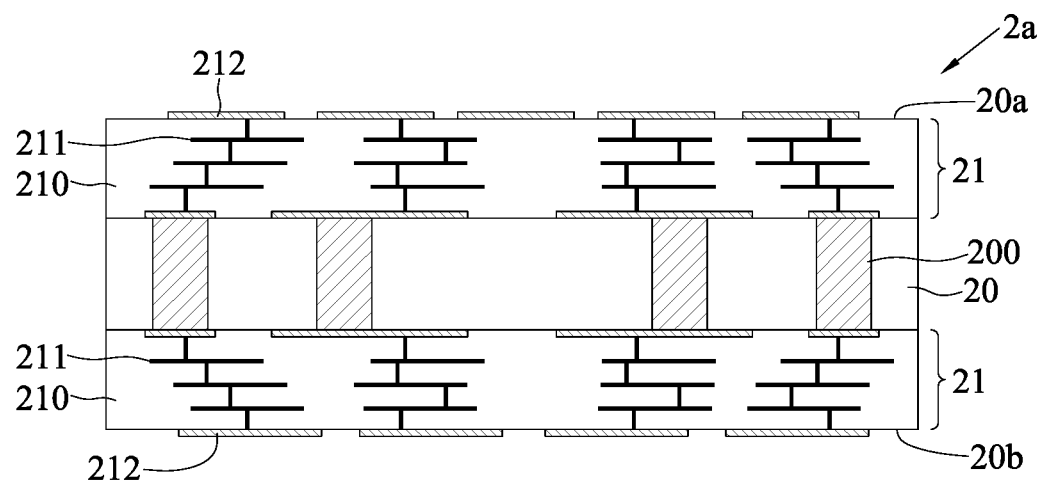
FIGS. 2A to 2C are cross-sectional views illustrating a method for fabricating a semiconductor package carrier board of a first embodiment according to the present disclosure.
Figure 2B:
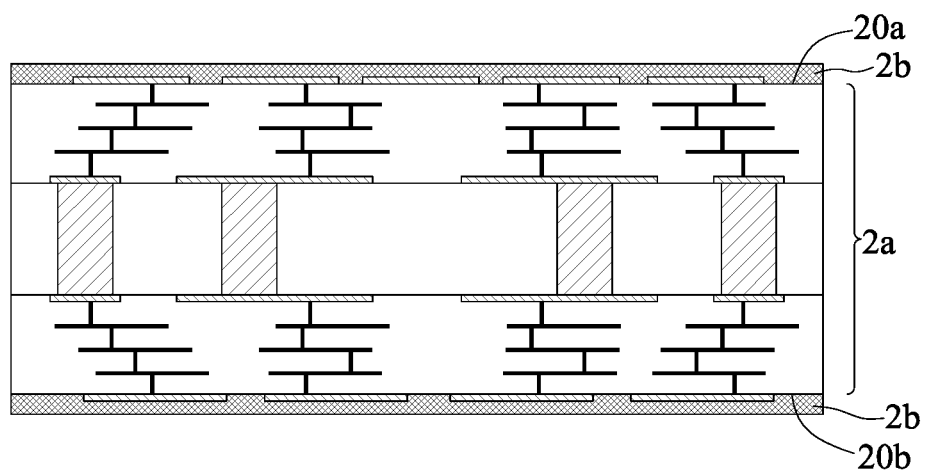
Figure 2C:
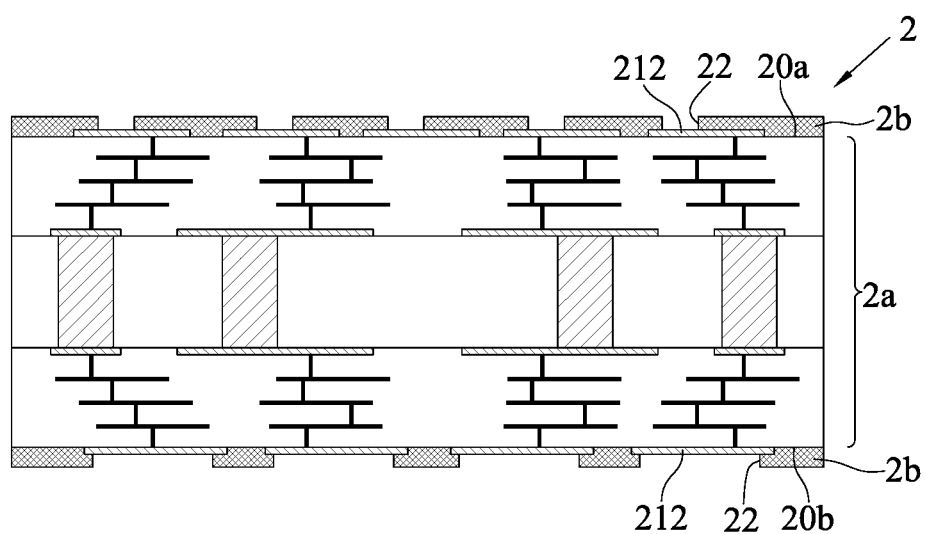

FIGS. 2A to 2C are cross-sectional views illustrating a method for fabricating a semiconductor package carrier board 2 of a first embodiment according to the present disclosure.

As shown in FIG. 2A, a circuit structure 2a is provided. The circuit structure 2a has a first side 20a and a second side 20b opposing the first side 20a. An electronic component, such as a semiconductor chip and a passive element, can be mounted on the first side 20a and the second side 20b, and an external side where the semiconductor chip is mounted is called a chip mounting side. In an embodiment, the first side 20a is the chip mounting side.

In an embodiment, the circuit structure 2a has a core layer 20 and a plurality of conductive parts 200 formed therein. In another embodiment, the core layer 20 is formed by a substrate containing glass fiber and organic resin, such as bismaleimide triazine (BT), FR4, FR5, etc., or a highly rigid organic substrate containing a filler (e.g., $SiO_2$) and no glass fiber, by performing thereon a via fabricating process, such as a mechanical hole drilling or laser hole drilling step, and forming a conductive material in the holes. In another embodiment, the conductive parts 200 are composed of a single conductive pillar or a plurality of conductive pillars stacked on one another.

The circuit structure 2a further comprises a built-up part 21 disposed on the core layer 20 and having at least one dielectric layer 210 and a plurality of circuit layers 211 bonded to the dielectric layer 210. The outermost layer of the circuit layers 211 has a plurality of solder pads 212. In an embodiment, the dielectric layer 210 is made of liquid epoxy resin, ABF film, prepreg, epoxy molding compound (EMC) or light sensitive resin. It should be understood that the number of layers of the circuit layers 211 can be designed on demand. In another embodiment, the core layer 20 of the circuit structure 2a is a silicon substrate, the dielectric layer 210 and the circuit layers 211 are disposed on the silicon substrate, and the circuit structure 2a becomes a silicon interposer. In yet another embodiment, the circuit structure 2a is a coreless layer.

As shown in FIG. 2B, an insulation heat dissipating layer 2b is formed on the first side 20a and the second side 20b of the circuit structure 2a to act as a solder resist structure. In an embodiment, the heat conductivity of the insulation heat dissipating layer 2b is greater than 0.4 W/m·k, i.e., greater than the heat conductivity of the ink or solder mask of the prior art.

In an embodiment, the insulation heat dissipating layer 2b is a graphene layer, which has heat conductivity of 5300 W/m·k. The solder resist structure can be designed on demand.

The insulation heat dissipating layer 2b is coated onto the whole surface of the first side 20a and the second side 20b of the circuit structure 2a.

As shown in FIG. 2C, a plurality of holes 22 are formed on the insulation heat dissipating layer 2b, with the plurality of solder pads 212 exposed from the plurality of holes 22.

In an embodiment, the insulation heat dissipating layer 2b is formed on the first side 20a and the second side 20b of the circuit structure 2a. In another embodiment, the insulation heat dissipating layer 2b is formed on the first side 20a or the second side 20b of the circuit structure 2a on demand.

Figure 2D:
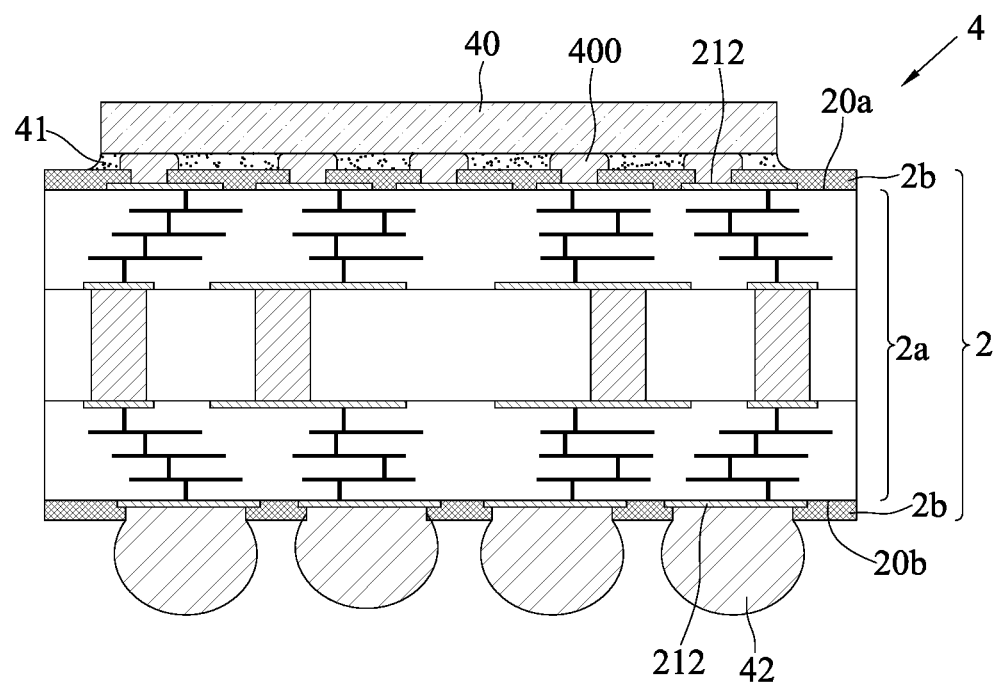
FIG. 2D is a cross-sectional view of an electronic package of a first embodiment according to the present disclosure.

In an electronic package 4 as shown in FIG. 2D, at least one electronic component 40 is disposed on the exposed solder pads 212 of the first side 20a of the circuit structure 2a, and an encapsulating layer 41 is formed on the first side 20a and bonded to the electronic component 40. In another embodiment, conductive elements 42, such as solder balls, are mounted on the exposed solder pads 212 of the second side 20b of the semiconductor package carrier board 2, for a circuit board (not shown) to be bonded thereon.

The electronic component 40 is an active element, such as a semiconductor chip, a passive element, such as a resistor, a capacitor and an inductor, or a combination thereof. In an embodiment, the electronic component 40 is a semiconductor chip, and is electrically connected in a flip-chip manner via a plurality of conductive elements 400 containing solder bumps to the solder pads 212 of the semiconductor package carrier board 2. In another embodiment, the electronic component is electrically connected in a wire bonding manner via a plurality of solder wires (not shown) to the solder pads 212. The electronic component can be electrically connected to the semiconductor package carrier board 2 in other manners. In an embodiment, the electronic component is disposed on the second side 20b or embedded in the built-up part 21.

In an embodiment, the encapsulating layer 41 is an underfill, which is formed between the first side 20a of the semiconductor package carrier board 2 and the electronic component 40 and encapsulates the plurality of conductive elements 400. In another embodiment, the encapsulating layer 41 is a thin film used in a compressing process, an encapsulant used in a molding process, or a glue material used in a printing process, and encapsulates the electronic component 40 and the plurality of conductive elements 400. In yet another embodiment, the encapsulating layer 41 is made of Polyimide (PI), epoxy resin, or a molding compound. It should be understood that the electronic component 40 can be packaged in other manners.

In an embodiment, the semiconductor package carrier board 2 uses a highly heat conductive material (e.g., graphene) to replace the ink or solder mask of the prior art, and the insulation heat dissipating layer 2b therefore has high heat conductivity, which is 15 thousand times as high as the heat conductivity of the ink or solder mask. Therefore, the insulation heat dissipating layer 2b not only has solder resist function, but can also dissipate the heat generated by the semiconductor package carrier board 2 quickly, making the overall performance and service life of the electronic package 4 more stable.

The plurality of conductive elements 400 and 42 are in contact with the insulation heat dissipating layer 2b. Therefore, the heat of the electronic package 4 can be dissipated quickly via the plurality of conductive elements 400 and 42 through the insulation heat dissipating layer 2b, and the electronic package 4 thus has improved performance and service life.

FIGS. 3A to 3D are cross-sectional views illustrating a method for fabricating a semiconductor package carrier board 3 of a second embodiment according to the present disclosure. The second embodiment differs from the first embodiment in the solder resist structure.

Figure 3A:
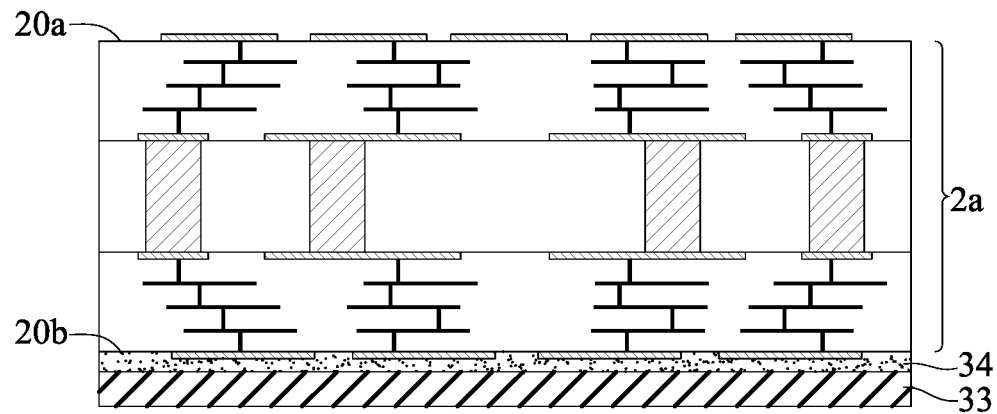
FIGS. 3A to 3D are cross-sectional views illustrating a method for fabricating a semiconductor package carrier board of a second embodiment according to the present disclosure.

As shown in FIG. 3A, a rigid layer 33 made of a conductive material or a non-conductive material is bonded onto the second side 20b of the circuit structure 2a via a bonding material 34.

In an embodiment, the rigid layer 33 is a steel board, a nickel alloy (an alloy 42) leaf, a highly rigid ceramic material (e.g., $Al_2O_3$ or AlN), plastic, carbon fiber, or other highly rigid non-conductive material. In another embodiment, the bonding material 34 is an adhesive material.

Figure 3B:
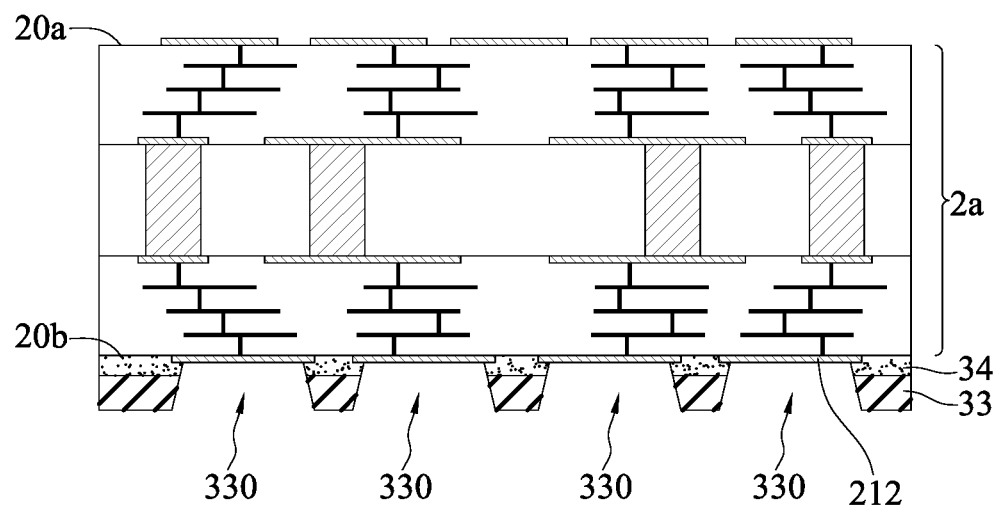

As shown in FIG. 3B, a plurality of first holes 330 are formed on the rigid layer 33 and extend through the bonding material 34, with the plurality of solder pads 212 exposed from the plurality of first holes 330.

Figure 3C:
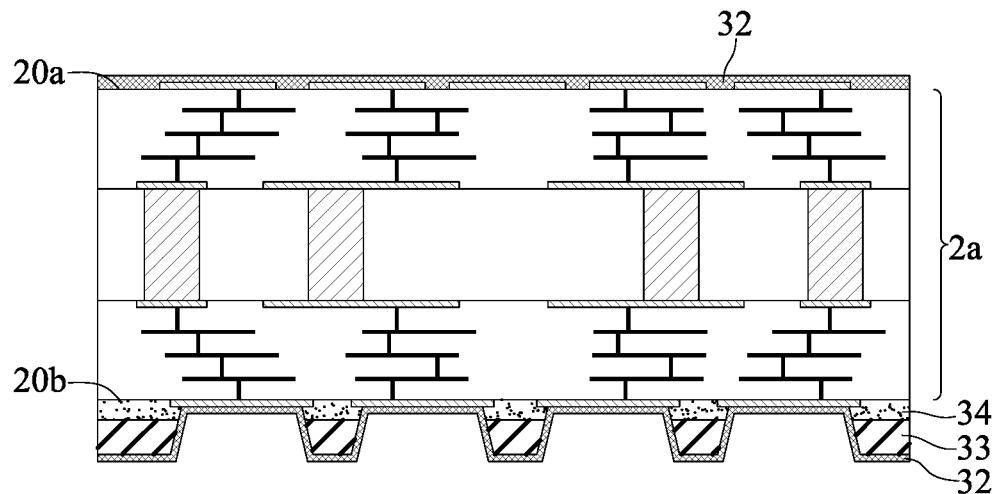

As shown in FIG. 3C, an insulation heat dissipating layer 32 is formed on the solder pads 212, non-bonding surfaces of the rigid layer 33 and hole walls of the first holes 330 to cover the rigid layer 33.

In an embodiment, the heat conductivity of the insulation heat dissipating layer 32 is greater than 0.4 W/m·k, i.e., the heat conductivity of the ink or the solder mask, and is a graphene layer, for example.

In an embodiment, the insulation heat dissipating layer 32 is also formed on the first side 20a of the circuit structure 2a.

Figure 3D:
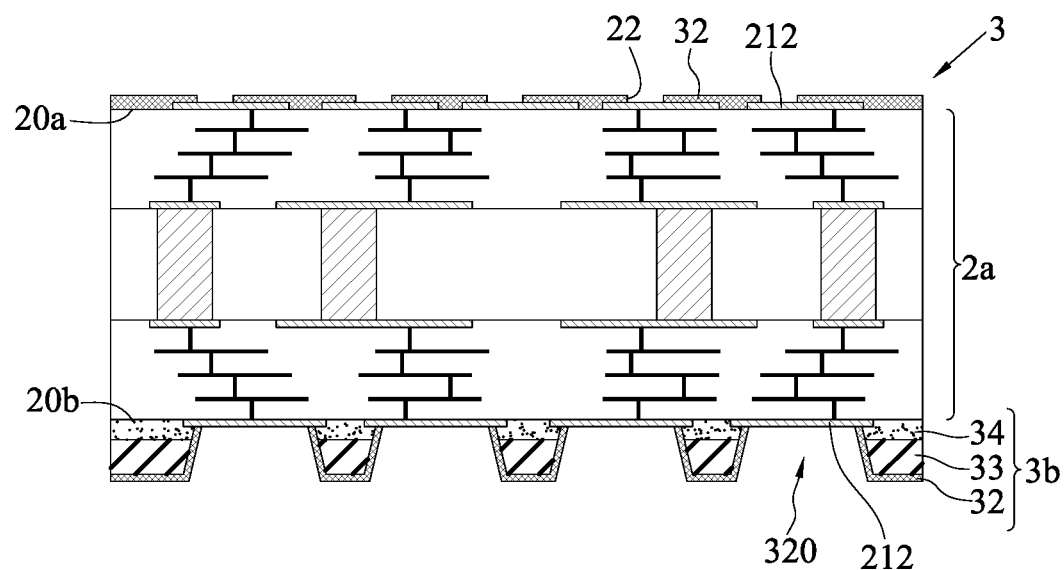

As shown in FIG. 3D, a plurality of second holes 320 are formed on the insulation heat dissipating layer 32 on the second side 20b, with the plurality of solder pads 212 exposed from the plurality of second holes 320. The insulation heat dissipating layer 32 and the rigid layer 33 act as a solder resist structure 3b. The insulation heat dissipating layer 32 remains on the hole walls of the plurality of second holes 320.

In an embodiment, the plurality of holes 22 are formed on the insulation heat dissipating layer 32 on the first side 20a, to form the aspect of the insulation heat dissipating layer 2b (the solder resist structure) shown in FIG. 2C.

In another embodiment, the solder resist structure on the first side 20a is changed to the solder resist structure 3b shown in FIG. 3D.

Figure 3E:
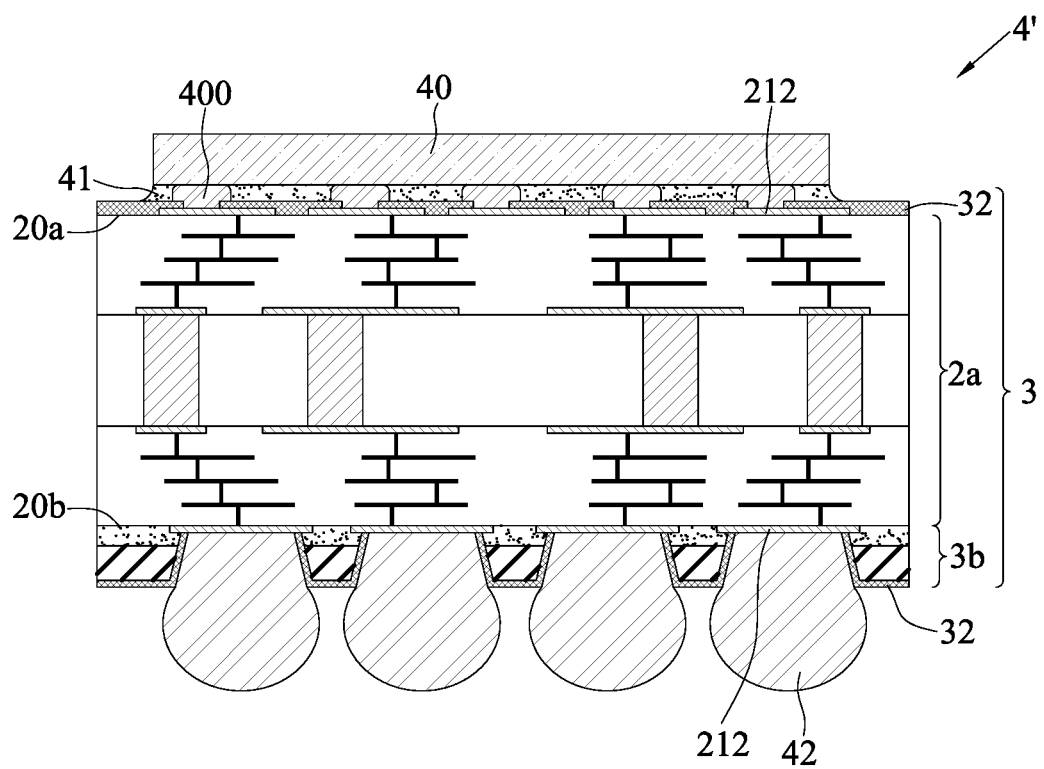
FIG. 3E is a cross-sectional view of an electronic package of a second embodiment according to the present disclosure.

In an electronic package 4' shown in FIG. 3E, the electronic component 40 is disposed on the exposed solder pads 212 of the first side 20a of the circuit structure 2a, and the encapsulating layer 41 is formed on the first side 20a and bonded to the electronic component 40. In another embodiment, the plurality of conductive elements 42 are mounted onto the exposed solder pads 212 of the second side 20b of the semiconductor package carrier board 3.

In the semiconductor package carrier board 3 according to the present disclosure, the rigid layer 33 is disposed in the solder resist structure 3b, and the insulation heat dissipating layer 32 encapsulates the rigid layer 33. Compared with the prior art, after the semiconductor package carrier board 3 according to the present disclosure is packaged, the plurality of conductive elements 400 and 42 will be in contact with the insulation heat dissipating layer 32, such that the heat of the electronic package 4' can be conducted via the plurality of conductive elements 400 and 42 through the insulation heat dissipating layer 32 to the rigid layer 33, and the heat dissipating effect is enhanced. Therefore, the electronic package 4' has an improved performance and an increased lifespan.

According to the present disclosure, the semiconductor package carrier board 3 uses the highly rigid rigid layer 33, which can enhance the heat dissipating effect and increase the structural strength of the semiconductor package carrier board 3.

In the semiconductor package carrier board and the electronic package having the same according to the present disclosure, graphene, which is very good at heat dissipation, is used as the insulation heat dissipating layer (or the solder resist structure), and the solder balls (conductive elements) are in contact with the graphene, to dissipate the heat accumulated on the semiconductor package carrier board quickly. Therefore, the semiconductor package carrier board and the electronic package having the same according to the present disclosure have a very high heat dissipation speed, and can be applied to a high power product demanding a highly heat dissipating capability.

Accordingly, the electronic product containing the semiconductor package carrier board or the electronic package according to the present disclosure has improved performance. When the present disclosure is applied to a high-level product designed with a high density circuit/high transmission speed, the product has an improved overall performance, and is highly reliable and durable.

The foregoing descriptions of the detailed embodiments are illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A semiconductor package carrier board, comprising:
   a circuit structure having a first side, a second side opposing the first side, at least one dielectric layer, and a circuit layer bonded to the dielectric layer, wherein the circuit layer of the first side and the circuit layer of the second side have a plurality of solder pads; and
   a graphene layer serving as an insulation heat dissipating layer disposed on at least one of a whole surface of the first side and a whole surface of the second side of the circuit structure, and formed with a plurality of holes, with the plurality of solder pads exposing from the plurality of holes.

2. The semiconductor package carrier board of claim 1, further comprising:
   a bonding material; and
   a rigid layer bonded to the second side of the circuit structure via the bonding material,
   wherein the plurality of holes extend into the rigid layer to expose the plurality of solder pads of the second side of the circuit structure, and
   wherein the insulation heat dissipating layer is disposed on the rigid layer and hole walls of the plurality of holes, without being disposed on the plurality of solder pads exposed from the plurality of holes.

3. The semiconductor package carrier board of claim 2, wherein the rigid layer is made of a conductive material.

4. The semiconductor package carrier board of claim 2, wherein the rigid layer is made of a non-conductive material.

5. The semiconductor package carrier board of claim 2, further comprising a plurality of conductive elements bonded to the plurality of solder pads in the plurality of holes and being in contact with the insulation heat dissipating layer.

6. The semiconductor package carrier board of claim 1, further comprising a plurality of conductive elements bonded to the plurality of solder pads exposed from the plurality of holes on at least one of the first side and the second side of the circuit structure and being in contact with the insulation heat dissipating layer.

7. An electronic package, comprising:
   the semiconductor package carrier board of claim 1;
   a plurality of conductive elements bonded onto the plurality of solder pads exposed from at least one of the first side and the second side of the circuit structure and being in contact with the insulation heat dissipating layer;
   an electronic component mounted in a flip-chip manner on the plurality of conductive elements of the first side of the circuit structure; and
   an encapsulating layer disposed on the semiconductor package carrier board and bonding the electronic component onto the semiconductor package carrier board.

8. The electronic package of claim 7, further comprising:
   a bonding material;
   a rigid layer bonded to the second side of the circuit structure via the bonding material and provided with a plurality of holes,
   wherein the plurality of solder pads of the second side of the circuit structure expose from the plurality of holes,
   wherein the insulation heat dissipating layer is disposed on the rigid layer and hole walls of the plurality of holes, without being disposed on the plurality of solder pads exposed from the plurality of holes, and
   wherein the plurality of conductive elements are bonded to the plurality of solder pads exposed from the second side of the circuit structure and are in contact with the insulation heat dissipating layer.

9. The electronic package of claim 8, wherein the rigid layer is made of a conductive material.

10. The electronic package of claim 8, wherein the rigid layer is made of a non-conductive material.

11. A method for fabricating a semiconductor package carrier board, comprising:
    providing a circuit structure having a first side, a second side opposing the first side, at least one dielectric layer, and a circuit layer bonded to the dielectric layer, wherein the circuit layer of the first side and the circuit layer of the second side have a plurality of solder pads;
    forming a graphene layer serving as an insulation heat dissipating layer on at least one of a whole surface of the first side and a whole surface of the second side of the circuit structure; and
    forming a plurality of holes on the insulation heat dissipating layer, wherein the plurality of solder pads are exposed from the plurality of holes.

12. The method of claim 11, further comprising:
    bonding a rigid layer via a bonding material onto the second side of the circuit structure;
    forming a plurality of another holes on the rigid layer, from which the plurality of solder pads of the second side of the circuit structure are exposed;
    encapsulating the rigid layer and the plurality of another holes of the rigid layer with the insulation heat dissipating layer; and
    removing the insulation heat dissipating layer on the plurality of solder pads in the plurality of another holes to form the plurality of holes, with the insulation heat dissipating layer on the hole walls of the plurality of another holes remained.

13. The method of claim 12, wherein the rigid layer is made of a conductive material.

14. The method of claim 12, wherein the rigid layer is made of a non-conductive material.

15. The method of claim 12, further comprising:
    providing a plurality of conductive elements in contact with the insulation heat dissipating layer; and bonding the plurality of solder pads in the plurality of another holes of the rigid layer to the plurality of conductive elements.

16. The method of claim 11, further comprising:
providing a plurality of conductive elements in contact with the insulation heat dissipating layer; and
bonding the plurality of solder pads exposed in the plurality of holes of at least one of the first side and the second side of the circuit structure to the plurality of conductive elements.

* * * * *